United States Patent
Borg et al.

(10) Patent No.: US 9,768,251 B2
(45) Date of Patent: Sep. 19, 2017

(54) METHOD FOR MANUFACTURING A SEMICONDUCTOR STRUCTURE, SEMICONDUCTOR STRUCTURE, AND ELECTRONIC DEVICE

(71) Applicant: International Business Machines Corporation, Armonk, NY (US)

(72) Inventors: Mattias B. Borg, Rueschlikon (CH); Kirsten E. Moselund, Rueschlikon (CH); Heike E. Riel, Rueschlikon (CH); Heinz Schmid, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/947,632

(22) Filed: Nov. 20, 2015

(65) Prior Publication Data
US 2016/0155798 A1  Jun. 2, 2016

(30) Foreign Application Priority Data
Nov. 28, 2014 (GB) .................................. 1421182.5

(51) Int. Cl.
*H01L 29/06* (2006.01)
*H01L 29/78* (2006.01)
(Continued)

(52) U.S. Cl.
CPC .... *H01L 29/0657* (2013.01); *H01L 21/02381* (2013.01); *H01L 21/02543* (2013.01);
(Continued)

(58) Field of Classification Search
None
See application file for complete search history.

(56) References Cited

U.S. PATENT DOCUMENTS 5,360,754 A * 11/1994 Pribat ..................... C30B 25/18
117/90
2004/0012037 A1   1/2004 Venkatesan et al.
(Continued)

OTHER PUBLICATIONS

Hwei Yin Serene Koh; Rapid Melt Growth of Silicon Germanium for Heterogeneous Integration on Silicon, Stanford University, https://purl.stanford.edu/fn296xd8769, Aug. 2011, pp. 1-238.
Nurfarina Zainal, et al.; Characterization of Rapid Melt Growth (RMG) Process for High Quality Thin Film Germanium on Insulator; ECS Trans. 20, 2012, vol. 45, Issue 4, pp. 169-180.
Thanh Hoa Phung, et al., Rapid-Melting-Growth of Ge on Insulator Using Cobalt (Co) Induced-Crystallized Ge as the Seed for Lateral Growth, Dept. of Electrical and Computer Engineering, National University of Singapore, Nov. 2010, pp. 1-3.
(Continued)

*Primary Examiner* — Ermias Woldegeorgis
(74) *Attorney, Agent, or Firm* — Cantor Colburn LLP; David Quinn

(57) ABSTRACT

A method for manufacturing a semiconductor structure comprises the steps of: providing a substrate including a first semiconductor material; forming a dielectric layer on a surface of the substrate; forming an opening in the dielectric layer having a bottom reaching the substrate; providing a second semiconductor material in the opening and on the substrate, the second semiconductor material being encapsulated by a further dielectric material thereby forming a filled cavity; melting the second semiconductor material in the cavity; recrystallizing the second semi-conductor material in the cavity; laterally removing the second semiconductor material at least partially for forming a lateral surface at the second semiconductor material; and forming a third semiconductor material on the lateral surface of the second semiconductor material, wherein the third semiconductor material is different from the second semiconductor material.

12 Claims, 9 Drawing Sheets

(51) Int. Cl.
*H01L 29/16* (2006.01)
*H01L 21/02* (2006.01)

(52) U.S. Cl.
CPC .. *H01L 21/02546* (2013.01); *H01L 21/02639* (2013.01); *H01L 21/02647* (2013.01); *H01L 29/16* (2013.01); *H01L 29/785* (2013.01); *H01L 21/02667* (2013.01)

(56) References Cited

U.S. PATENT DOCUMENTS

| | | |
|---|---|---|
| 2008/0149941 A1 | 6/2008 | Li et al. |
| 2013/0119518 A1 | 5/2013 | Kitai et al. |
| 2013/0196459 A1 | 8/2013 | Na |
| 2014/0185981 A1 | 7/2014 | Assefa et al. |

OTHER PUBLICATIONS

Kue Bai, et al., Si Incorporation From the Seed Into Ge Stripes Crystallized Using Rapid Melt Growth, Applied Physics Letters 104, 0521104 (2014) AIP Publishing, http://dx.doi.org/10.1063/1.4863976, pp. 052104:1-3.

Yaocheng Liu, et al., MOSFETs and High-Speed Photodetectors on Ge-on-Insulator Substrates Fabricated Using Rapid Melt Growth, Stanford University, IEDM04-1001, 2004, pp. 40.4.1- 40.4.4.

Ze Yuan, et al., Optimal Device Architecture and TERO-Integration Scheme for III-V CMOS, 2013 Symposium on VLSI Technology Digest of Technical Papers, pp. T54-T55.

* cited by examiner

METHOD FOR MANUFACTURING A SEMICONDUCTOR STRUCTURE, SEMICONDUCTOR STRUCTURE, AND ELECTRONIC DEVICE

FOREIGN PRIORITY

This application claims priority to Great Britain Patent Application No. 1421182.5, filed Nov. 28, 2014, the contents of which in its entirety are herein incorporated by reference.

BACKGROUND

This disclosure relates to a method for manufacturing a semiconductor structure. This disclosure further relates to a semiconductor structure, and an electronic device.

Silicon is the basic material for present solid-state electronics, and processing techniques have been evolved for decennials. Hence, most electronic integrated circuit devices are based on silicon. However, the relatively low charge carrier mobility and its indirect band gap are disadvantages and limit the use of silicon in particular in opto-electronic applications. It would be advantageous to combine more suitable semiconductor materials, such as II-VI, III-V or IV-IV compound semiconductors with silicon-based electronics on common silicon substrates.

A monolithic integration of compound semiconductors on silicon wafers is desirable and has extensively been in the past. Several problems need to be overcome when compound semiconductors and conventional silicon technologies are be combined. First, there is a large lattice mismatch between a crystalline silicon substrate and compound semiconductor crystals. Further, there is a thermal expansion coefficient mismatch between the (silicon) wafer material and the active compound semiconductor material. Additionally, a structural mismatch between the diamond crystal structure of Si and the polar crystal structures of III-V and II-VI compound semiconductors may occur. It is an overall goal to achieve high crystalline quality over various monolithic layers for compound semiconductor on a foreign substrate such as silicon.

In an effort to achieve high crystalline quality in crystalline material layers that show a lattice mismatch, several methods have been developed. For example, direct epitaxy of blanket layers allow for a gradual transition from one lattice parameter to the next. However, relatively thick transition layers are needed to reduce the defect density considerably.

Techniques to combine compound semiconductor materials with conventional silicon wafers include bonding techniques. In direct wafer bonding, a compound heterostructure is fabricated on a donor wafer wherein the donor wafer material is eliminated after bonding with the conventional silicon wafer. This makes the bonding technology relatively expensive. Further, bonding is limited to the size of costly compound substrate wafers.

Another approach for combining lattice-mismatched materials such as compound semiconductors with silicon substrates is the aspect ratio trapping approach. Aspect ratio trapping (ART) refers to a technique where crystalline defects are terminated at non-crystalline, for example dielectric, sidewalls. U.S. Pat. No. 8,173,551 B2 discloses a method where a silicon substrate is covered with a dielectric layer defining trenches through to the substrate material. In the trenches, epitaxial films of a compound material are deposited wherein particular geometries of the growth front are realized. The aspect ratio of the trenches needs to be large enough to terminate the defects that nucleate at the silicon-compound interface so that higher parts of the crystalline compound show a low crystalline defect density. Some approaches of the ART technique teach the use of germanium microcrystals grown in silicon oxide trenches on a silicon substrate with a gallium arsenide film on top.

Another approach is disclosed in "High-quality single-crystal Ge on insulator by liquid-phase epitaxy on Si substrates" by Y. Liu, M. D. Deal and J. D. Plummer, Appl. Phys. Lett. 84, 2563 (2004). Amorphous germanium is encapsulated by dielectric layers on top of a silicon substrate. After being melted by rapid heating, germanium recrystallizes during a cooling process. Crystalline defects originating from the seed window terminate at the dielectric walls due to the geometry of the encapsulated volume. Using this method, it is possible to obtain a semiconductor material free from crystalline defects, e.g. twinning defect. Also the recrystallization of the III-V semiconductors InAs and GaSb with this method was recently demonstrated, as presented in "Optimal Device Architecture and Hetero-Integration Scheme for III-V CMOS" by Z. Yuan, A. Kumar, C.-Y. Chen, A. Nainani, P. Griffin, A. Wang, W. Wang, M. H. Wong, R. Droopad, R. Contreras-Guerrero, P. Kirsch, R. Jammy, J. Plummer, K. C. Saraswat, Symp. VLSI Techn. Digest 2013. On the other hand, diffusion and intermixing effects of the semiconductor material occur due to the applied high temperature, and it is difficult to apply this technique for recrystallizing ternary compounds, e.g. indium gallium arsenide. Furthermore, it is not possible to obtain sharp hetero-junctions via this technique.

It is therefore desirable to provide improved devices comprising lattice mismatched crystalline semiconductor materials and methods for fabricating such.

SUMMARY

According to an embodiment of the present invention, a method for manufacturing a semiconductor structure comprising providing a substrate including a first semiconductor material, forming a dielectric layer on a surface of the substrate, forming an opening in the dielectric layer having a bottom reaching the substrate, providing a second semiconductor material in the opening and on the substrate, the second semiconductor material being encapsulated by a further dielectric material, thereby forming a filled cavity, melting the second semiconductor material in the cavity, recrystallizing the second semiconductor material in the cavity, forming an opening in the further dielectric material, laterally removing the second semiconductor material at least partially for forming a lateral surface at the second semiconductor material, and forming a third semiconductor material on the lateral surface of the second semiconductor material.

According to another embodiment of the present invention, a semiconductor structure comprises a substrate comprising a first semiconductor material, a dielectric layer on the substrate, a second semiconductor material arranged on the dielectric layer, the second semiconductor material being crystalline and having an essentially flat lateral surface, and a third semiconductor material grown on the lateral surface.

BRIEF DESCRIPTION OF THE DRAWINGS

In the following, embodiments of semiconductor structures and methods and devices relating to the manufacture of semiconductor structures are described with reference to the enclosed drawings.

Like or functionally like elements in the drawings have been allotted the same reference characters, if not otherwise indicated. It is understood that the drawings are schematic and do not depict geometric features to scale.

DETAILED DESCRIPTION

Figure 1:
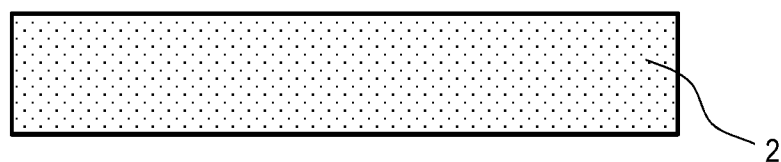
FIGS. 1-18 show schematic diagrams illustrating structures involved during process steps for manufacturing embodiments of semiconductor structures including substrates and semiconductor materials.

Next, specific embodiments are disclosed based on a method for fabricating a semiconductor structure. The method may in particular comprise the steps of: providing a substrate including a first semiconductor material; providing a dielectric layer on a surface of the substrate; forming an opening in the dielectric layer having a bottom reaching the substrate; providing a second semiconductor material in the opening and on the substrate, the second semiconductor material being encapsulated by a further dielectric material, in particular, thereby forming a cavity with the second semiconductor material thereby forming a filled cavity; melting the second semiconductor material in the cavity; recrystallizing the second semiconductor material in the cavity; forming an opening in the further dielectric material; laterally removing at least a part of the second semiconductor material for forming a partially empty cavity between the dielectric layer and the further dielectric material, and a lateral surface at the second semiconductor material inside the cavity; forming a third semiconductor material on the lateral surface of the second semiconductor material.

The step of providing a second semiconductor material can include the steps of: forming a cavity or template enclosed by the dielectric layer and a further dielectric material, wherein the cavity is communicatively coupled to the opening; and filling the opening and the cavity with a second semiconductor material.

Alternatively, the steps of forming a cavity and filling the opening and the cavity can be implemented in terms of the steps of or be replaced by the steps of providing a second semiconductor material on a surface of the dielectric layer; structuring the second semiconductor material, providing a further dielectric material on the dielectric layer and the second semiconductor material for encapsulating the second semiconductor material, thereby forming a filled cavity.

Here, the term of cavity may relate to a space, hollow or filled or partly filled, formed inside a solid or fluid matter, wherein the cavity is suitable for enclosing and confining materials that are in a different state and/or of a different material from their surroundings, e.g. for containing fluids inside a solid matter. A cavity is not necessarily sealed on all sides.

It is understood that a lateral face or surface refers to a side of a material that is essentially perpendicular to a plane defining a superficial area of the substrate or the dielectric layer. A process of laterally removing can include removing material from an edge of a general flat material layer. One can speak of removing the material in-plane in contrast to decreasing a thickness of the material normal to the plane.

E.g. the second, third and further semiconductor material can be considered as confined from below by the dielectric layer (bottom) and from above by the template or cavity formed by the dielectric material (top). Removing the second, third and further semiconductor material laterally or from one side can be construed as removing a portion from a side of the material that is not two-dimensionally attached to the bottom-dielectric layer and/or to the top-dielectric material.

In a sandwich structure comprising planes including the dielectric layer, the second semiconductor material and a cap layer formed of the further dielectric material, laterally removing the second semiconductor material proceeds in a "lateral" direction which is a direction parallel to the planes. The process of removing laterally generally proceeds in a direction towards the bulk or an inner region of the section comprising the second semiconductor material. Similar considerations apply when the step of removing laterally is performed repeatedly in connection with a third or further material.

A feasible orientation of the lateral surface of the second semiconductor material after the step of laterally removing is, e.g. perpendicular to the top face of the substrate. However, any other orientation of the lateral surface that is not parallel to the top face of the substrate can be conceived.

The third semiconductor material may be different from the second semiconductor material. The third semiconductor material can comprise any crystalline elemental semiconductor materials and/or crystalline compound semiconductor materials. Furthermore, the third semiconductor materials can comprise the same semiconductor material as the second semiconductor material with a different type of doping.

In the method, the nucleation, i.e. the initial occurrence of a crystalline phase in a fluid or an amorphous phase, of the second semiconductor material occurs at the interface between the second semiconductor material and the substrate inside the opening and initiates the recrystallization process. After growing out of the opening, the crystalline phase of the second semiconductor material extends laterally during the recrystallization process. The first and the second semiconductor materials possibly have a lattice mismatch with respect to one another. Crystalline defects, for example twinning defect and/or dislocation defect, can occur and propagate under specific angles during the recrystallization process. Such defects terminate at the dielectric walls and can therefore not reach farther into the second semiconductor material, i.e. the propagation of crystalline defects is limited to a volume above the seed window, i.e. the opening in the dielectric layer, inside the cavity, since the ratio of the cross-section of the opening to the lateral extension of the cavity is low.

The cross-section of the opening has, for example, an extension of up to 100 nm, while the cavity can be formed with a typical lateral extension of greater than 1 μm. After being fully recrystallized, the second semiconductor material can be laterally removed so as to form a lateral surface. Removing the second semiconductor material can be performed by chemical etching, wet etching, sputtering, or evaporation.

In embodiments, the flat lateral surface at the elongated structure formed by the second semiconductor material is a seed for growing the third semiconductor material as a crystalline material. The third, and optionally further semiconductor materials, having the same or a similar crystal structure, after being deposited, can be shaped and used as an extended elongated seed for a subsequently grown semiconductor material.

In embodiments, melting the second semiconductor material comprises heating above a melting point of the second semiconductor material for a predetermined time. In particular, the second semiconductor material is heated to a temperature slightly above its melting point. e. g. between one and ten seconds. However, one can also realize a melt for a smaller time interval, e.g. between 1 millisecond and a second. Thus, the second semiconductor material in amorphous solid state is melted. Heating can be performed, for example, by resistively heating the substrate. However, rising the temperature above the melting point can also be achieved by a radiative heating process.

In embodiments, recrystallizing comprises cooling the second semiconductor material below the melting point of the second semiconductor material. The crystalline state of the second semiconductor material is obtained by cooling the melt below the melting point of the second semiconductor material. In this way, the occurrence of crystalline defects in the second semiconductor material can be suppressed.

In embodiments, the method further comprises forming an opening in the further dielectric material for accessing the interior of the cavity. Thus, it is possible to process the material that is located inside or fills the cavity. It is preferable, but not mandatory, that this opening is formed laterally on a side of the dielectric material, e.g. removing a lateral face of the dielectric material.

In embodiments, laterally removing the second semiconductor material comprises forming an elongated structure of the second semiconductor material along a lateral wall of the cavity and forming a flat surface at the elongated structure. An elongated structure can have a predominant direction in which the spatial extension of the structure is larger than in a perpendicular direction thereto. An elongated structure, e.g. a bar or a beam, can have a base and a length, wherein the base can be polygonally or round shaped. The flat surface formed laterally at the elongated structure is suitable for growing a crystalline semiconductor material on the flat surface. Arranging two or more different semiconductor materials parallel to each other can be thereby facilitated.

In embodiments, recrystallizing the second semiconductor material sets in at an interface between the substrate and the second semiconductor material inside the opening in the dielectric layer. A crystalline structure, a so-called seed, allows for a non-crystalline semiconductor material to recrystallize. Here, the opening in the dielectric layer provides a seed window for the recrystallization of the second semiconductor material. The crystalline structure of the second semiconductor material is initially formed, i.e. the nucleation of the second semiconductor material takes place, at the interface between the substrate and the second semiconductor material.

In embodiments, laterally removing the second semiconductor material comprises selectively etching the second semiconductor material without etching the dielectric layer and the dielectric material. The dielectric structure, i.e. the combination of the dielectric layer and the further dielectric material, forms the cavity and encloses the second semiconductor material at least partially. One may contemplate of the dielectric material forming a template for the second semiconductor material portion(s). Thus, it is possible to form further semiconductor materials with the similar spatial extensions, for example having the same lateral surface as the second semiconductor material, on the lateral surface of the second semiconductor material.

In embodiments, the dielectric layer comprises the further dielectric material. The aforementioned dielectric structure can be made of one single dielectric material, thereby facilitating the production. E.g. the cavity or template may be one integral structure formed of an oxide of the first semiconductor material.

A compound semiconductor material used as third semiconductor material, for example, includes a III-V compound semiconductor material, a II-VI compound semiconductor material, and/or a IV-IV compound semiconductor material. In particular, indium gallium arsenide and/or gallium arsenide has a higher carrier mobility than silicon and allows for fast semiconductor devices. The disclosed features for a semiconductor structure and the methods may also hold for Ge-based devices. E.g. it is understood that the second and/or third semiconductor material can be germanium. Throughout his disclosure embodiments are envisaged where the term "compound semiconductor material" is also used for germanium as a semiconductor material.

One embodiment comprises silicon as first semiconductor material and germanium as second semiconductor material, and the dielectric material and layer comprises silicon oxide.

In embodiments, forming the third semiconductor material comprises a vapor epitaxial process. The application of the vapor epitaxy facilitates the crystal growth on the lateral surface of the second semiconductor material, grants a high purity of the semiconductor material and a good crystalline quality of the third semiconductor material.

According to an embodiment, the method comprises forming a further semiconductor material on a lateral surface of the third semiconductor material. The further semiconductor material may be different from the third semiconductor material. According to an embodiment the further semiconductor material may be the same material as the second semiconductor material.

According to a further embodiment the method comprises forming another layer of the third semiconductor material on the further semiconductor material and subsequently selectively removing the layer of the further semiconductor material. The layer of the further semi-conductor material that is subsequently removed may serve as intermediate layer to provide isolated areas of the third semiconductor material. This may provide a suitable base for further device manufacturing.

According to an embodiment a plurality of layers or pairs of layers of the third semiconductor material and of one or more further semiconductor materials may be provided. According to a further embodiment one or more of the plurality of layers of the further semiconductor materials may be removed subsequently. This may again provide isolated areas of layers of the third semiconductor material and may provide a suitable base for further device manufacturing.

According to a further embodiment the second semiconductor material may be subsequently removed.

In embodiments, the method comprises successively forming at least two different semi-conductor materials on the lateral surface of the second semiconductor material. Thus, a combination of a plurality of different semiconductor materials can be manufactured, which can provide, for example, a basis for a field effect transistor.

In embodiments, the method further comprises forming the plurality of different semi-conductor materials as elongated elements which are essentially parallel to each other.

Attaching electrical contacts to each of the different semiconductor materials is thereby facilitated.

Embodiments of the method comprises removing the further dielectric material after the required semiconductor structure is obtained by the method described above. The further dielectric material can be removed by etching, sputtering and/or evaporating. This step may be required, for example, before attaching electrical contacts to the different semiconductor materials.

In embodiments, the second semiconductor material and/or the third semiconductor material and/or the further semiconductor material comprises germanium and/or a compound semi-conductor material including a III-V compound semiconductor material, a II-VI compound semiconductor material, a IV-VI compound semiconductor material, a II-V compound semiconductor material, and/or a IV-IV compound semiconductor material. In particular, the second and third semiconductor material can comprise a binary, a ternary, and/or a quaternary compound semiconductor material, for example aluminium gallium indium phosphide, indium gallium arsenide, aluminium arsenide, gallium arsenide, indium arsenide, aluminium antimonide, gallium antimonide, indium antimonide, aluminium phosphide, gallium phosphide, indium phosphide, gallium nitride, zinc selenide, zinc sulfide, silicon carbide, indium selenide, boron nitride, boron arsenide, aluminium nitride, cadmium selenide, cadmium sulfide, cadmium telluride, zinc oxide, zinc telluride, cuprous chloride, copper sulfide, lead selenide, lead sulfide, lead telluride, tin sulfide, tin telluride, lead tin telluride, thallium tin telluride, thallium tin germanium telluride, bismuth telluride, cadmium phosphide, cadmium arsenide, cadmium antimonide, zinc phosphide, and/or zinc arsenide, zinc antimonide.

This disclosure also presents a semiconductor structure manufactured according to a method as disclosed above or below with respect to specific examples.

In embodiments, the semiconductor structure can comprise:
a substrate comprising a first semiconductor material,
a dielectric layer on the substrate,
a second semiconductor material arranged on the dielectric layer, the second semiconductor material being crystalline and having an essentially flat lateral surface), and
a third semiconductor material grown on the lateral surface.

The semiconductor structure is in particular suitable for being processed and integrated with other devices that are based on silicon processing technology. Optionally, the method may comprise further processing the crystalline compound semiconductor material for fabricating electronic or optoelectronic devices.

In embodiments, the semiconductor structure comprises a further dielectric material on the dielectric layer, forming a cavity that can be filled by the second semiconductor material. The dielectric material may be removed at a later point in time in preparation of manufacturing an end product, e.g. attaching electrical contacts.

In embodiments, the semiconductor structure comprises an opening in the dielectric layer with one end reaching the surface of the substrate and the other end reaching the cavity. A portion of the substrate surface is thereby exposed to the cavity. The opening can be filled with the second semiconductor material.

In embodiments, the semiconductor structure comprises an opening in the further dielectric material for processing the second semiconductor material inside the cavity. The opening can be formed at any surface of the dielectric material and makes the cavity accessible from the outside. The opening is preferably formed by removing a lateral wall of the further dielectric material.

In embodiments, the second semiconductor material is formed as an elongated structure along an inner wall of the cavity opposing the opening in the further dielectric material. Accessing via the opening in the further dielectric material, further semiconductor material can be grown on the surface of the second semiconductor material. The accessible surface of the second semiconductor material for a third semiconductor is, e.g. a face spanning between a lower dielectric surface of the dielectric layer and an upper surface of the enclosure or cavity facing the lower surface.

In embodiments, the semiconductor structure further comprises one or more crystalline semiconductor materials each formed laterally and adjacent to each other, on at least one side bordered by the second semiconductor material. Thus, the different semiconductor materials are in contact with each other and can provide the basis for an electric device, for example a field effect transistor or a laser.

In embodiments, each of the crystalline semiconductor materials has an elongated shape arranged essentially parallel to each other. Thus, the semiconductor structure can be easily processed for manufacturing an end product.

In embodiments, the semiconductor structure comprises one or more isolated areas or layers of crystalline semiconductor materials, wherein the isolated areas or layers of crystalline semiconductor materials have been fabricated by selectively removing one or more intermediate areas or layers of the crystalline semiconductor materials. In other words, at first one or more layers or areas of different crystalline semiconductor materials are formed laterally and adjacent to each other. Then one or more intermediate layers or areas of the adjacent layers or areas of crystalline semiconductor materials are selectively removed, thereby isolating the remaining areas or layers of crystalline semiconductor materials.

This disclosure furthermore presents an electronic device that comprises a semiconductor structure according to the above description. The electronic device can also be an opto-electronic device and/or an integrated circuit. The electronic device can be part of a larger and/or more complex device.

Certain embodiments of the presented semiconductor structure and the method for fabricating a semiconductor structure may comprise individual or combined features, method steps or aspects as mentioned above or below with respect to exemplary embodiments.

FIG. 1 shows a schematic diagram of a substrate 2 suitable for providing a base for a semiconductor structure 1. The substrate 2 comprises a first semiconductor material, for example crystalline silicon. The substrate 2 can be a wafer, for example. Hence, in a first step the substrate 2 is provided.

Next, a dielectric layer 3 is grown on the substrate 2. There are various feasible embodiments of the method for manufacturing the semiconductor structure 1 as disclosed here. Four specific embodiments are described in detail below. Depending on the embodiment, the process of forming the dielectric layer 3 on top face of the substrate 2 can be modified.

Figure 2:
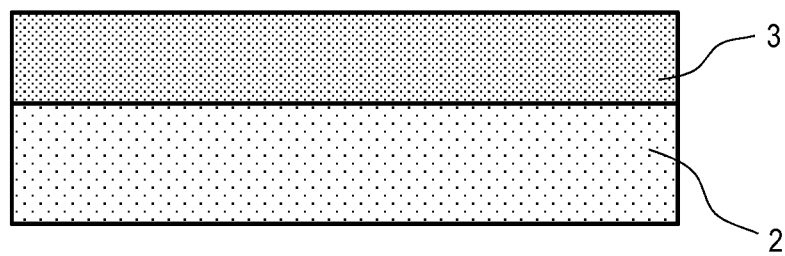
Figure 3:
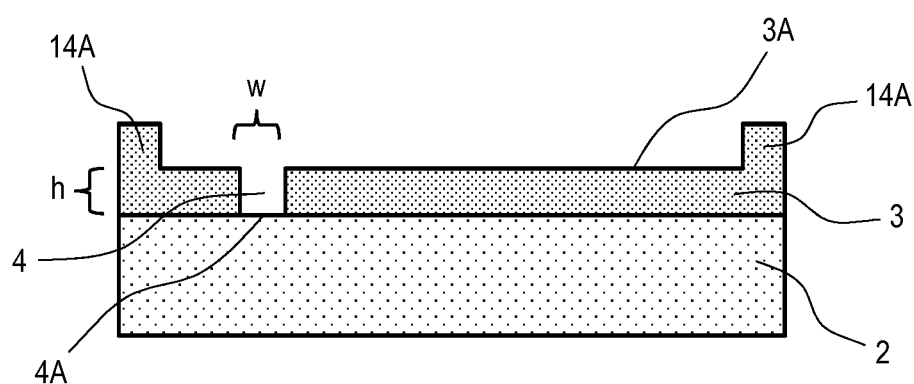

The first embodiment is depicted schematically in connection with FIGS. 2 to 5. The dielectric layer 3 is deposited on the top face of the substrate 2, as shown in FIG. 2. The dielectric layer 3 is generally even and thus arranged parallel to the top face of the substrate 2. The dielectric layer 3 is then partially etched away in order to provide a lower plane suitable for depositing the second semiconductor material 7 on a top surface 3A of the dielectric layer 3, bordered on the sides by dielectric sidewalls 14A. Furthermore, an opening 4 is formed such that a bottom 4A of the opening 4 reaches a portion of the surface of the substrate 2. The opening has a height h and cross-sectional spatial extension w, as indicated in FIG. 3.

Figure 4:
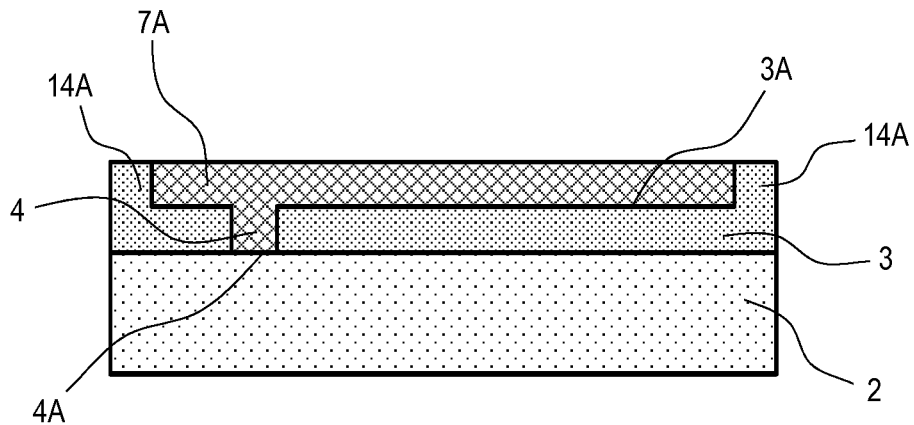
Figure 5:
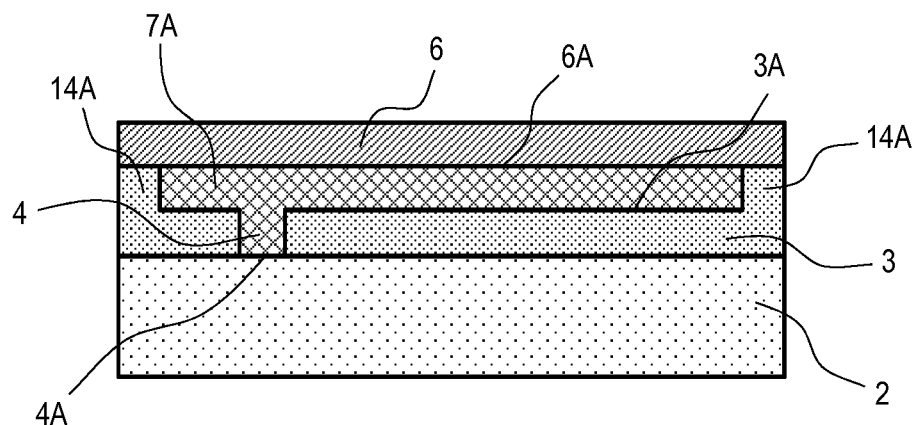

Next, an amorphous second semiconductor material 7A is deposited on the top surface 3A of the dielectric layer 3 and in the opening 4 in the dielectric layer 3, as shown in FIG. 4. Then, the further dielectric material 6 is deposited on top of both the second semiconductor material 7A and the dielectric sidewalls 14A. A lower surface 6A of the further dielectric material 6 is in surface contact with the second dielectric material 7A, as shown in FIG. 5.

Figure 6:
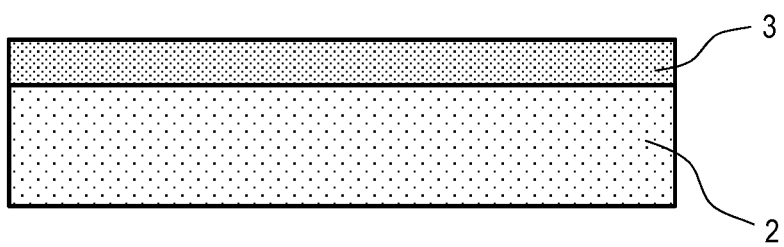
Figure 7:
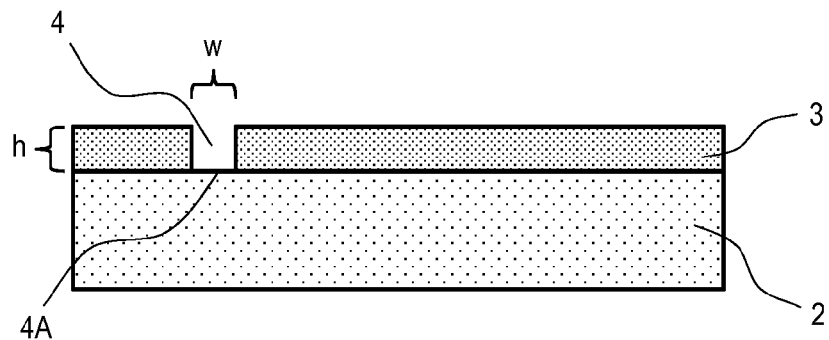

FIGS. 6 and 7 show the manufacturing steps according to further embodiments. After the substrate 2 is provided as shown in FIG. 1, the dielectric layer 3 is formed on the top face of the substrate 2, as shown in FIG. 6. Then, an opening 4 is formed in the dielectric layer 3 with a height h and cross-sectional spatial extension w. A bottom 4A of the opening 4 reaches a portion of the top face of the substrate 2, as shown in FIG. 7.

Figure 8:
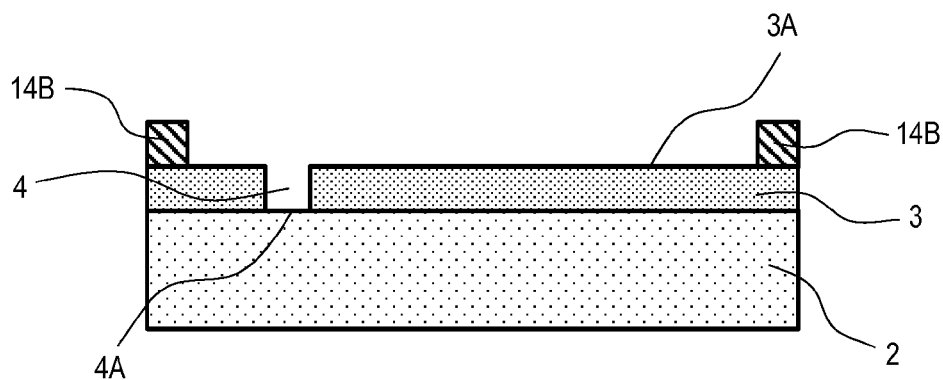
Figure 9:
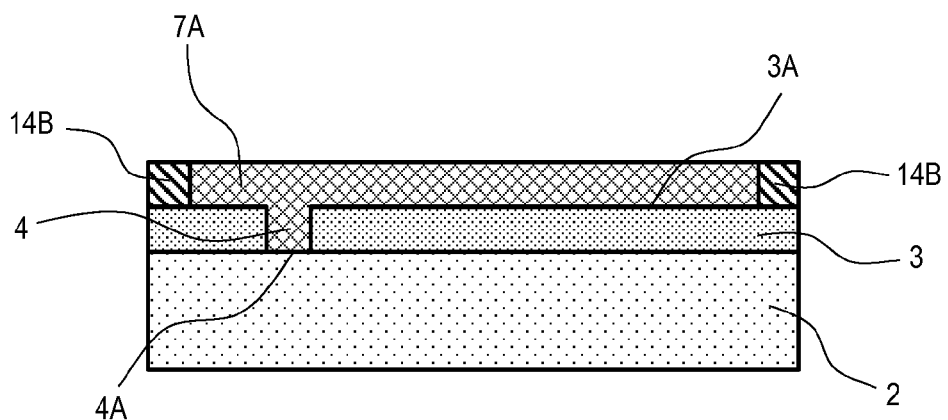
Figure 10:
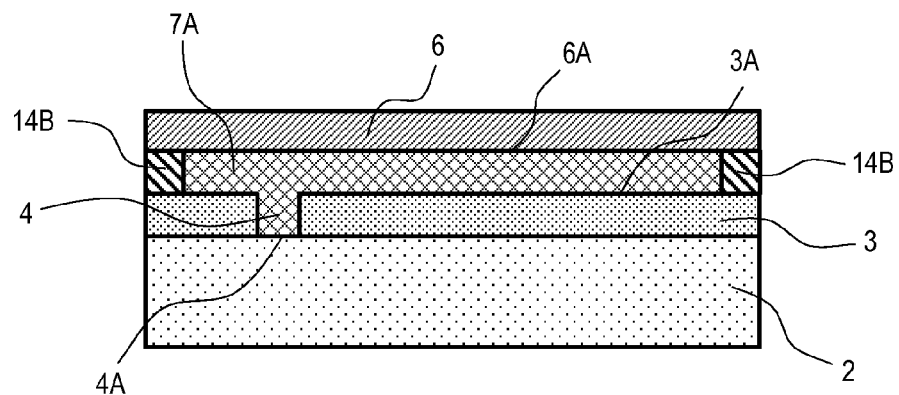

According to a second embodiment, which is illustrated in FIGS. 8 to 10 as successive steps, dielectric sidewalls 14B are formed on the top surface 3A of the dielectric layer 3 so as to border a plane that is suitable for depositing a second semiconductor material 7, as shown in FIG. 8. The dielectric sidewalls 14B can be made of the same dielectric material as the dielectric layer 3, or a different dielectric material.

Next, the second semiconductor material 7A is deposited in a region on the top surface 3A of the dielectric layer 3 bordered by the dielectric sidewalls 14B such that it fills the opening 4 as well. Subsequently, the further dielectric material 6 is deposited on top of the second semiconductor material 7A such that the second semiconductor material 7A is completely covered by the further dielectric material 6, as shown in FIG. 10.

Figure 11:
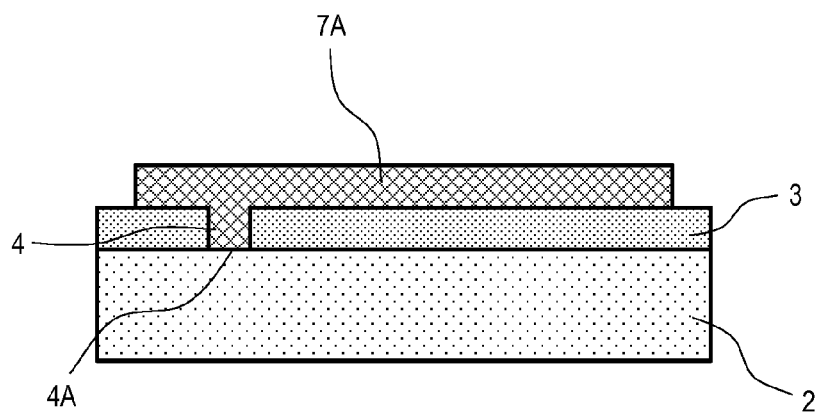
Figure 12:
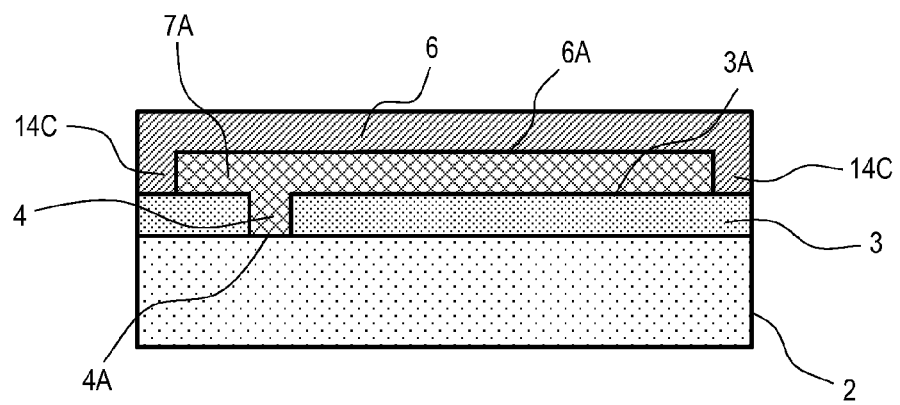

Aspects of a third embodiment of the method are illustrated by FIGS. 11 and 12. After providing the substrate 2, forming the dielectric layer 3 on top of the substrate 2 and forming an opening 4 in the dielectric layer 3 as described above, the amorphous second semi-conductor material 7A is deposited on the top surface 3A of the dielectric layer 3 in a way that the opening 4 is filled with the second semiconductor material 7A as well and the top surface 3A of the dielectric layer 3.

Then the second semiconductor material is formed by patterning and etching steps.

Then, the further dielectric material 6 is deposited on top of the second semiconductor material 7A and on the top surface 3A of the dielectric layer 3 such that the second semi-conductor material is enclosed on the top and lateral sides by the further dielectric material 6 and the dielectric sidewalls 14C of the further dielectric material 6 and on the lower side by the top surface 3A of the dielectric layer 3, as shown in FIG. 12.

Figure 13:
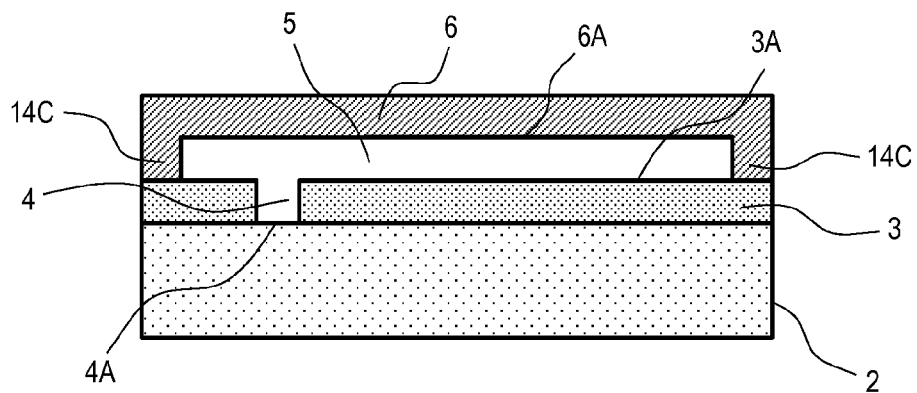

A fourth embodiment of the disclosed method comprises a step of forming a cavity 5 on top of the dielectric layer 3 in order to realize a template or enclosure for subsequently used fluid materials. The further dielectric material 6 is deposited on the top surface 3A of the dielectric layer 3 such that a cavity 5 is enclosed by the further dielectric material 6, the dielectric side-walls 14C of the further dielectric material 6 and the dielectric layer 3, as shown in FIG. 13. The cavity 5 is positioned so as to be communicatively coupled with the opening 4. In this embodiment, the cavity 5 is, for example, formed in the shape of a block with a rectangular base and four rectangular lateral faces. However, other geometries can be used. The dielectric layer 3 and the further dielectric material 6 can comprise the same dielectric material.

In other embodiments, the step of forming the cavity 5 may involve growing and patterning a sacrificial material having the form and geometry of the desired cavity. The sacrificial material a can be removed so as to leave a void region at least partially encapsulated by the further dielectric material 6. This void can be used as the cavity 5 or template as explained below. As a result, a semiconductor structure 1 is obtained that can be used to manufacture a compound semiconductor structure for further processing.

Then, the second semiconductor material 7A is inserted into the cavity. An opening can be formed on a side or top face of the further dielectric material 6 for this purpose. The component atoms of the second semiconductor material 7A can be lead into the cavity in a fluid or vapor state possibly as parts of larger molecules, for example, and can react in the cavity to form the solid material. FIG. 12 illustrates the second semiconductor material 7A filling the cavity 5. Here, the opening 4 in the dielectric layer 3 is also filled with the second semi-conductor material 7A.

The dielectric layer 3 can comprise silicon oxide and/or silicon nitride, for example. The dielectric material forming the dielectric layer 3 can be obtained by thermally oxidizing the surface of a wafer. However, one can contemplate other methods for fabricating a dielectric layer.

The further dielectric material can comprise silicon oxide and/or silicon nitride, for example. Preferably the further dielectric material can be selectively removed without affecting the semiconductor material and/or the dielectric layer 3.

In other embodiments, the further dielectric material optimized for the RMG process can be selectively removed after the RMG process and another dielectric layer optimized for the later process steps may be deposited instead.

The opening 4 includes, in the orientation of the figures, a top, sidewalls and a bottom 4A. The bottom 4A of the opening 4 reaches a portion of the top surface of the substrate 2. A cross-sectional extension or width w of the opening 4 is preferably between 0 nm and 400 nm. More preferably the extension is between 10 nm and 200 nm, but may depend on the subsequently used semiconductor materials. Referring to the embodiments according to FIGS. 7-13 the height h of the opening 4 corresponds to the thickness of the dielectric layer 3. Referring to FIGS. 3-5 the height h extends from the bottom 4A to the top surface 3A of the dielectric layer.

The opening is, for example, adapted such that an aspect ratio (w/h) is less than one. A width w can be considered as the largest lateral extension of a cross-section of the opening 4 perpendicular to a height h of the opening 4. The opening 4 does not need to have a regular geometry, but preferably is rectangular, circular or quadratic. In case of a rectangular cross section having side lengths a and b, where a>b, the width could be considered w=a.

The second semiconductor material 7 can comprise a III-V compound semiconductor material, a II-VI compound semiconductor material, a IV-VI compound semiconductor material, a II-V compound semiconductor material, and/or a IV-IV compound semiconductor material. In particular, the second semiconductor material 7 can comprise a binary, a ternary and/or a quaternary compound semiconductor material. The step of filling can include a deposition method, e.g. vapor deposition process, chemical vapor deposition process, sputtering or the like.

After forming the second semiconductor material 7A on the top surface 3A of the dielectric layer 3 and enclosing it by the further dielectric material 6, a rapid melt growth process (RMG) is performed. To this end, the amorphous second semiconductor material 7A is melted by heating above its melting point for a predetermined time, for example up to 10 seconds, preferably 5 seconds and even more preferred 1 second. One can also contemplate of a time interval between 1 millisecond and 1 second during which the fluid state of the material occurs. Accordingly, the second semiconductor material 7A is in a fluid state such that, in particular, the bottom 4A of the opening 4 is filled with the second semiconductor material 7A.

In the following manufacturing steps, the region bordered by the dielectric sidewalls 14, which summarize the different types of the dielectric sidewalls 14A, 14B and 14C, the further dielectric material 6 and the dielectric layer 3 is referred to as the cavity 5 or the template. The reference is provided, too, even after an opening is formed by removing a dielectric sidewall 14.

Figure 14:
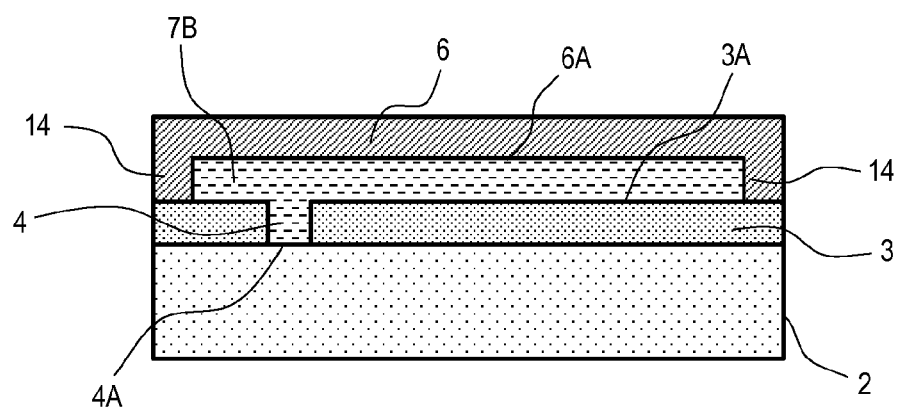

For generating a crystalline region comprising the second material 7A a crystallization step is initiated. During a cooling process, the melt of the second semiconductor material 7A recrystallizes. The nucleation takes place at the interface 4A between the substrate 2 and the second semiconductor material 7A inside the opening 4. Hence, the bottom 4A of the opening 4 acts as a seed for (re-)crystallizing the second semiconductor material 7A. The crystalline phase then propagates first upwards along the opening 4 into the cavity 5. From above the opening 4, the crystalline phase propagates laterally until the entire second semiconductor material 7 is crystalline. FIG. 14 illustrates the crystalline second semiconductor material 7B enclosed in the cavity 5. The process of recrystallizing the second semiconductor material 7A/7B is a rapid melt growth (RMG) process, for example.

Figure 19:
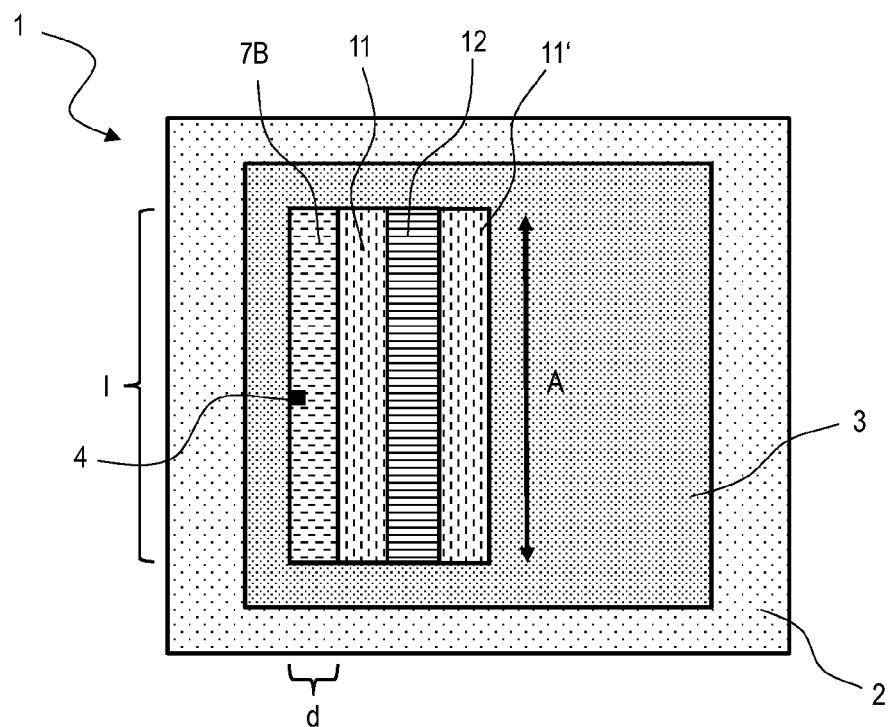
FIGS. 19 and 20 show schematic plan views of embodiments of the semiconductor structure comprising different semiconductor materials formed in elongated elements and arranged adjacent and parallel to each other.

Due to a potential lattice mismatch between the first and the second semiconductor material, crystalline defects, for example twinning defects and/or lattice dislocation, can occur and propagate during the recrystallizing process of the second semiconductor material 7. Some defects may terminate at the sidewalls of the opening 4 at the dielectric 3. The propagation of crystalline defects is essentially limited to a volume above the opening 4 in the dielectric layer 3 due to a small ratio of the cross-section of the opening 4 to the lateral extension of the cavity 5. Thus, the formation and/or propagation of crystalline defects in the crystalline phase of the second semiconductor material 7B is reduced, and a high-quality crystalline second semiconductor material 7B is obtained. The lateral extension on the surface of the dielectric layer 3 extends the cross-section of the opening 4. A top view is depicted in FIG. 19 showing the opening 4 (below the second crystalline material 7B) and an extension A of the region that is potentially available for RMG inside the cavity. A can be, for example, 1-100 μm. Embodiments encompass ratios of A/w between 10 and 100.

The cavity 5, used as a template for the patch, section or region of the second semiconductor material 7A, 7B, can have an opening for accessing the interior of the void encapsulated by the dielectric material 3, 6 and/or the filled cavity 5. This is illustrated in FIGS. 15-17.

Figure 15:
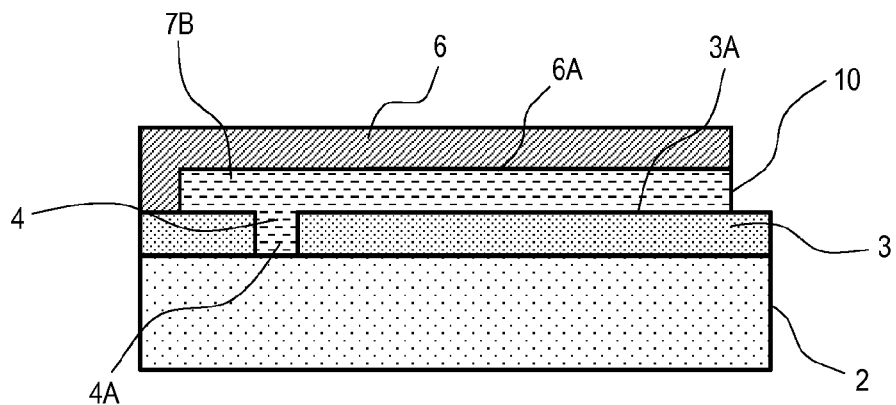

FIG. 15 shows an opening 10 formed in the further dielectric material 6 in order to shape the crystalline second semiconductor material 7B by removing a lateral section of the further dielectric material 6, thus exposing a lateral surface of the second semiconductor material 7B. The opening can be formed by selective etching, for example. In other embodiments the opening 10 can be arranged in a top surface of the dielectric enclosure 6, and a side face of the second semiconductor material is eventually formed e.g. by an etching step.

Figure 16:
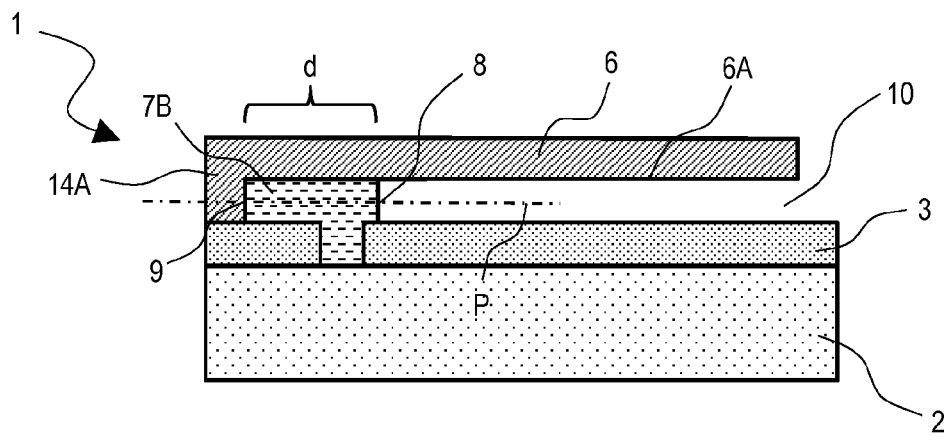

FIG. 16 shows an elongated structure of the second semiconductor material 7B remaining along a lateral wall 9 of the cavity 5 after being laterally removed, for example by chemical and/or wet etching. The elongated structure can be bar-like, beam-like, for example and borders on a lateral confinement wall 14A of the dielectric. The elongated structure has a width d and a length l (see FIG. 19, below). Neither the dielectric layer 3 nor the further dielectric material 6 is significantly removed while etching the second semiconductor material 7B to the desired shape. A flat lateral surface 8 is formed facing the opening 10 in the further dielectric material 6, and a semiconductor material different from the second semiconductor material 7 can be grown on the flat lateral surface 8 of the second semi-conductor material 7B, thereby forming a sharp hetero-junction. A plane P spanning in parallel to the dielectric layer 3 (and the upper confining surface 6A of the further dielectric 6 is indicated, the face 8 is explained in more detail below. Growing the further semiconductor material may include vapor epitaxial steps, for example. The second semiconductor material 7B can act as an elongated seed crystal for the third material 11 when epitaxially growing the third semiconductor material 11 laterally on the second elongated element 7B inside the template. Preferably the third and the second semiconductor material 7B, 11 have no or only a small lattice mismatch. E.g. the same material with different dopants can be used.

Figure 17:
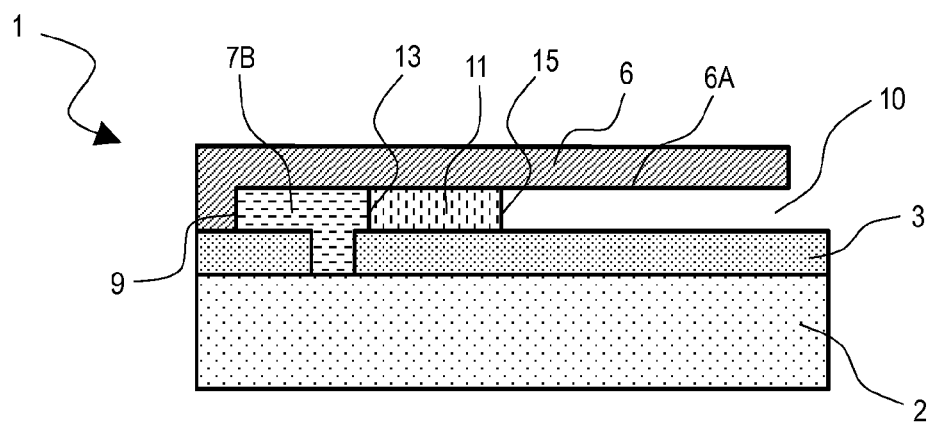

FIG. 17 shows a third semiconductor material 11 formed on the flat lateral surface 8 of the second semiconductor material 7B. The third semiconductor material 11 can comprise an elemental or a compound semiconductor material of any type that is different from the second semiconductor material 7 and/or is differently doped. Preferably, a semiconductor material which has a little lattice mismatch with the second semiconductor material is used as the third semiconductor material. The third semiconductor material 11 can be formed by a vapor epitaxial process. As a result, a junction 13 between the second and the third crystalline semi-conductor materials 7B, 11 can occur. Additionally, on can shape the third crystalline semi-conductor material 11 to obtain a flat lateral surface 14 and grow additional bar-like structures. The process of laterally growing a further semiconductor material can be repeated as required.

Figure 18:
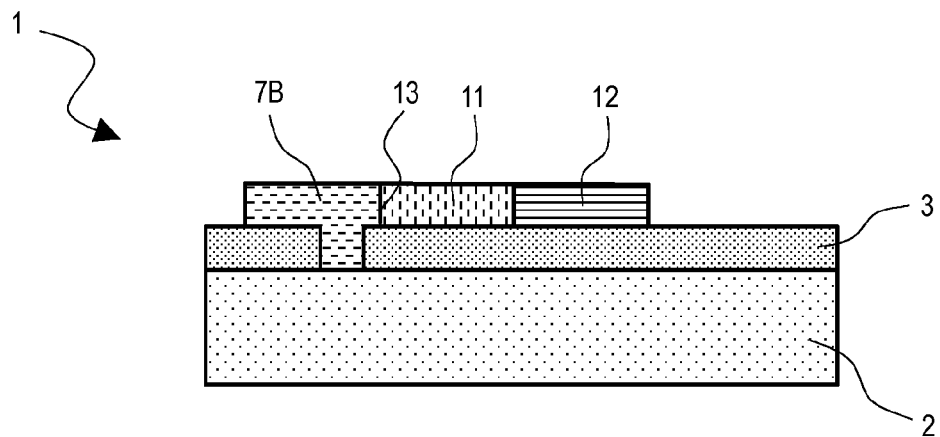

FIGS. 18 (cross-sectional view) and 19 (top view) show a fourth semiconductor material 12 formed laterally as further semiconductor material adjacent to the third semiconductor material 11 on a lateral surface 15 of the third semiconductor material 11, while the further dielectric material 6 is removed. The second, third and fourth semiconductor materials 7B, 11 and 12 are formed as elongated elements and arranged essentially parallel to each other. Further semiconductor materials can be formed each on a surface of the respective preceding semiconductor material. This step of forming another or further semiconductor material on the surface of the preceding semiconductor material can be performed repeatedly. For example, the third material 11' is epitaxially grown on the fourth material 12 from the right. It is understood, that the dielectric layer 3 can completely cover the substrate 2, and only for illustrative reasons the layers and material regions are depicted separately.

Figure 20:
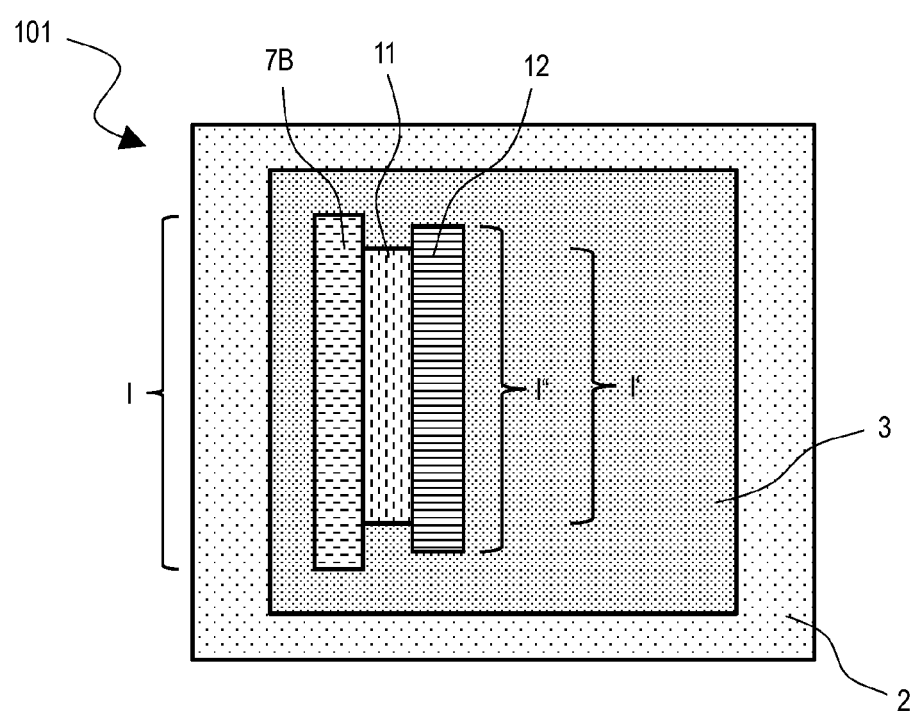

FIG. 20 shows a further embodiment of the semiconductor structure 101 manufactured along the method described. The structure 101 includes three different crystalline semiconductor materials 7B, 11 and 12 as elongated elements arranged adjacent and parallel to each other, each having different spatial extensions. i.e., different lengths 1, 1', 1'', respectively. For example, the initial elongated section 7A can be directly patterned into a shape with varying spatial extension, which after epitaxially growing the next semiconductor material elements 11, 12 results in a varying spatial extension of the elongated structures 7B, 11 and 12. For example, attaching an electrical contact is facilitated by providing different semiconductor materials with different geometries.

Figure 21A:
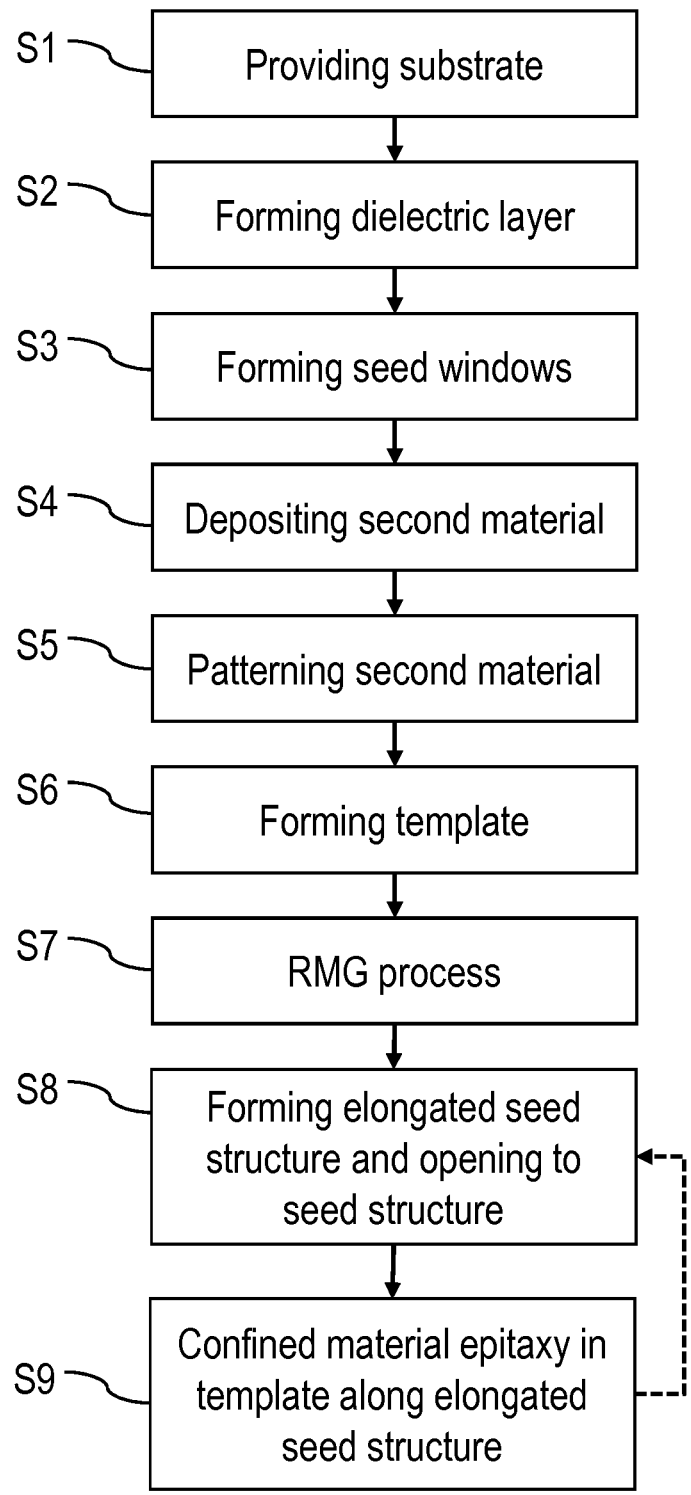
FIGS. 21A and 21B include a flow chart including method steps for manufacturing an electronic device.
Figure 21B:
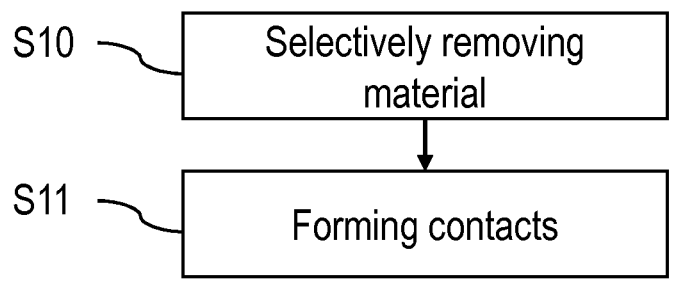

Next, an embodiment of a method for forming a semiconductor device is depicted. FIGS. 21A and 21B is a schematic flow chart and refers to aspects explained with respect to the foregoing figures.

First, in step S1 the substrate, e.g a silicon wafer 2 (FIG. 1), is provided and covered with a dielectric, such as silicon dioxide. This is done by thermally oxidizing a surface region of the wafer material (step S2). For example the wafer 2 is heated from below, and oxygen is pro-vided. One obtains a structure as depicted in FIG. 2. A hole or opening 4 is etched into the silicon oxide layer 3 such that a bottom 4A of the opening is in contact with the crystalline silicon as schematically shown in FIG. 7. Hence, a seed window for crystallizing another semiconductor material is fabricated (step S3).

In step S4 indium phosphide as a second semiconductor material is deposited on the dielectric layer thereby filling the opening 4. As a result an indium phosphide patch covers an extended region of the substrate 2 and dielectric 3, respectively. However, the indium phosphide is not in a crystalline state. This is reflected by the hatched region 7A in FIG. 7. The indium phosphide material 7A can be patterned (step S5) to a shape that is useful for subsequent steps.

It is envisioned to perform a rapid melt growth process with the indium phosphide. However, when melting the indium phosphide 7A a form or template for the fluid state is required. To this end, a dielectric enclosure 6 is formed (FIG. 12) where the patterned indium phosphide 7A corresponds to a negative form of the template 6. As a result, the indium phosphide 7A fills a cavity 5 formed by the dielectric material casing 6. In FIG. 21A, this is shown as step 6.

In the next step S7 an RMG process is carried out on the indium phosphide. This includes rapidly heating the material above its melting point of 1060° C., e.g. one second, and recrystallizing the melt. Crystallizing starts at the silicon interface from the bottom 4A of the seed window 4. An indium phosphide crystal 7B is obtained as shown in FIG. 14. Most or all crystal defects due to the lattice mismatch between silicon as seed and indium phosphide remain in the opening section 4.

Next, an edge of the dielectric enclosure is opened (FIG. 15) and an essentially flat lateral surface of the indium phosphide is etched (step S8, FIG. 16). This includes a wet chemical etching process which is selective to the semiconductor and does not remove the dielectric template 6.

Figure 22:
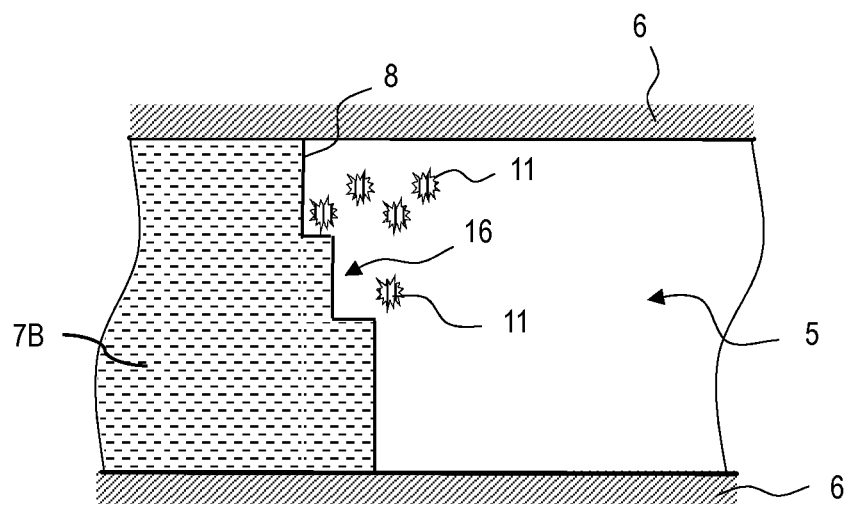
FIG. 22 is a detailed view of a cross-sectional plane P of a template or cavity used according to a method step shown in FIG. 16.

The lateral surface 8 of the indium phosphide can have mono-atomic steps. This facilitates the lateral step-flow epitaxial growth of a further semiconductor material that preferentially does not have a lattice mismatch with the indium phosphide crystal. FIG. 22 is a detailed top view of the cavity 5 after forming the elongated seed crystal 7B in plane P (indicated in FIG. 16) by removing crystalline indium phosphide material. Vapor epitaxy (step S9) of the lattice-matched ternary semiconductor indium gallium arsenide (InxGal-xAs) 12 is performed. An appropriate chemical composition x of the InxGal-xAs is x=0.53. The creation of steps at the lateral face of the indium phosphide can reduce the formation of twinning defects by allowing for the step-flow epitaxial growth mode in which growth occurs preferentially on the step edges. Other possible material combinations include but are not limited to InAs/Ga(As)Sb/Al(As)Sb, InP/InAlAs, and GaAs/Al(Ga)As/InGaP that only exhibit a small lattice mismatch and therefore can be suitable for repeated epitaxial growth.

The steps of forming a seed S8 and epitaxial lateral growth S9 can be performed repeatedly to obtain a sequence of crystalline semiconductor bars (see FIG. 19). E.g. additional indium phosphide bars and indium gallium arsenide bars are manufactured.

Figure 23:
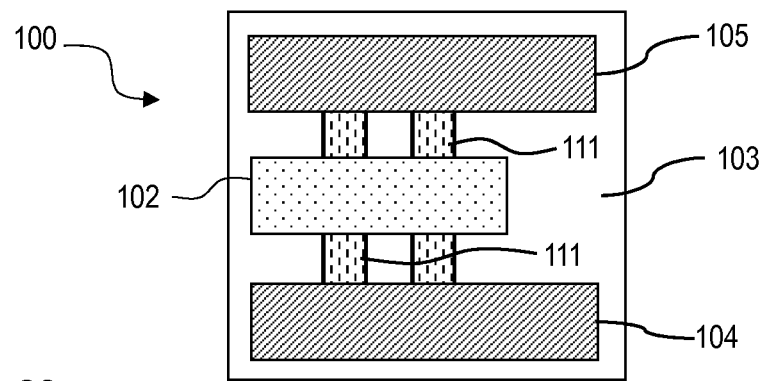
FIG. 23 is a top view of an embodiment of an FET manufactured along a method according to FIGS. 21A and 21B.

In order to obtain isolated indium gallium arsenide crystals the indium phosphide is selectively removed in a subsequent step S10. The indium gallium arsenide fins are then ready for use as an active material in an electric device, e.g. e transistor. The fin width is here controlled by the epitaxial growth process and the minimum width is not limited by lithographic constraints. An embodiment of a double Fin-FET is shown in a schematic top view in FIG. 23. The Fin-FET 100 includes the two indium gallium arsenide patches 111, wherein gate, source, and drain electrodes 102, 104, 105 are formed on top. Additional functional layers can be included although not expressly shown.

As a result, by combining RMG processes and lateral epitaxial deposition methods semi-conductor devices including compound materials in silicon wafers can be manufactured.

The proposed methods and devices provide a technique to form different compound semi-conductor materials in elongated shapes and arrange them adjacent and parallel to each other on silicon substrates. Consequently, manufacturing sharp hetero-junctions between com-pound semiconductor materials with silicon-based devices is facilitated.

The disclosed semiconductor structures 1, 101 can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried inter-connections). In any case the chip is then integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input device, and a central processor.

What is claimed is:

1. A method for manufacturing a semiconductor structure comprising:
   providing a substrate including a first semiconductor material;
   forming a dielectric layer on a surface of the substrate
   forming an opening in the dielectric layer having a bottom reaching the substrate;
   providing a second semiconductor material in the opening and on the substrate, the second semiconductor material being encapsulated by a further dielectric material, thereby forming a filled cavity;
melting the second semiconductor material in the cavity;
recrystallizing the second semiconductor material in the cavity;
forming an opening in the further dielectric material,
laterally removing the second semiconductor material at least partially for forming a lateral surface at the second semiconductor material; and
forming a third semiconductor material on the lateral surface of the second semiconductor material.

2. The method of claim 1,
wherein laterally removing the second semiconductor material comprises:
forming an elongated structure of the second semiconductor material along a lateral wall of the cavity, and
forming a flat lateral surface at the elongated structure.

3. The method of claim 2,
wherein laterally removing the second semiconductor material comprises:
selectively etching the second semiconductor material without etching the dielectric layer and/or the further dielectric material.

4. The method of claim 1,
wherein recrystallizing the second semiconductor material sets in at an interface between the substrate and the second semiconductor material inside the opening in the dielectric layer.

5. The method of claim 1,
wherein the flat lateral surface at the elongated structure is a seed for growing the third semiconductor material as a crystalline material.

6. The method of claim 1, wherein forming the third semiconductor material comprises a vapour epitaxial process.

7. The method of claim 1,
wherein melting the second semiconductor material comprises:
heating above a melting point of the second semiconductor material for a predetermined time, and
wherein recrystallizing comprises cooling the second semiconductor material below the melting point of the second semiconductor material.

8. The method of claim 1,
wherein the dielectric layer comprises the further dielectric material.

9. The method of claim 1 comprising:
forming a further semiconductor material on a lateral surface of the third semiconductor material.

10. The method according to claim 9, comprising:
forming another layer of the third semiconductor material on the further semiconductor material,
selectively removing the further semiconductor material and/or the second semiconductor material.

11. The method of claim 1,
wherein the second and/or the third and/or the further semiconductor material comprises germanium and/or a compound semiconductor material including a III-V compound semiconductor material, a II-VI compound semiconductor material, a IV-VI compound semiconductor material, a II-V compound semiconductor material, and/or a IV-IV compound semiconductor material.

12. A semiconductor structure formed by the method of claim 1.

* * * * *